(12) United States Patent
Hosokawa

(10) Patent No.: US 6,623,563 B2
(45) Date of Patent: Sep. 23, 2003

(54) SUSCEPTOR WITH BI-METAL EFFECT

(75) Inventor: Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 3 days.

(21) Appl. No.: 09/753,149

(22) Filed: Jan. 2, 2001

(65) Prior Publication Data

US 2002/0083898 A1 Jul. 4, 2002

(51) Int. Cl.$^7$ .............................................. C23C 16/00
(52) U.S. Cl. ................. 118/728; 219/444.1; 219/443.1; 219/544
(58) Field of Search ....................... 118/728; 219/444.1, 219/443.1, 544

(56) References Cited

U.S. PATENT DOCUMENTS

| | | | |
|---|---|---|---|
| 3,549,847 A | | 12/1970 | Clark et al. |
| 3,998,180 A | * | 12/1976 | Hawkins et al. ................ 118/5 |
| 5,232,507 A | * | 8/1993 | Ohtoshi et al. ............. 118/719 |
| 5,266,527 A | | 11/1993 | Robbins |
| 5,566,043 A | * | 10/1996 | Kawada et al. ............. 361/234 |
| 5,665,260 A | * | 9/1997 | Kawada et al. ............. 219/464 |
| 6,035,101 A | * | 3/2000 | Sajoto et al. ................ 392/416 |
| 6,120,661 A | * | 9/2000 | Hirano et al. .......... 204/298.15 |
| 6,160,244 A | * | 12/2000 | Ohashi ..................... 219/444.1 |
| 6,188,150 B1 | | 2/2001 | Spence |
| 6,188,838 B1 | * | 2/2001 | Mikata et al. ............... 392/418 |
| 6,204,486 B1 | * | 3/2001 | Masaki et al. ............ 219/444.1 |
| 6,280,584 B1 | | 8/2001 | Kumar et al. |
| 6,294,771 B2 | * | 9/2001 | Katsuda et al. ............. 219/544 |
| 6,320,649 B1 | | 11/2001 | Miyajima et al. |

FOREIGN PATENT DOCUMENTS

| | | | |
|---|---|---|---|
| DE | 44 46 992 | * 12/1994 | .......... C23C/14/50 |
| JP | 01-286339 | * 11/1989 | .......... H01L/23/12 |
| JP | 07031886 | 2/1995 | |
| JP | 11-330115 | * 11/1999 | .......... H01L/21/56 |
| WO | WO 01/11431 A2 | 2/2001 | |
| WO | WO 01/38600 | * 5/2001 | .......... C23C/16/00 |

OTHER PUBLICATIONS

U.S. patent application, Ser. No. 09/399,900 filed Sep. 21, 1999, entitled Support Frame for Substrates.

* cited by examiner

*Primary Examiner*—Benjamin L. Utech
*Assistant Examiner*—Karla Moore
(74) *Attorney, Agent, or Firm*—Dugan & Dugan

(57) ABSTRACT

In accordance with a first aspect, a susceptor is provided that includes (1) a supporting surface adapted to support a substrate, the supporting surface comprising a first material; and (2) a support frame encased within the first material, the support frame comprising a second material that has a lower coefficient of thermal expansion than the first material. The support frame is offset from a center of the susceptor toward the supporting surface. In accordance with a second aspect, a susceptor is provided that includes (1) a supporting surface adapted to support a substrate, the supporting surface comprising a first material; and (2) a support frame encased within the first material, the support frame comprising a second material that has a higher coefficient of thermal expansion than the first material. The support frame is offset from a center of the susceptor away from the supporting surface. Other aspects are also provided.

26 Claims, 7 Drawing Sheets

US 6,623,563 B2

SUSCEPTOR WITH BI-METAL EFFECT

BACKGROUND OF THE INVENTION

A flat panel display (FPD) typically comprises a glass or a glass like substrate having an array of thin-film transistors formed thereon. To form the array, the substrate is subjected to various high temperature processing steps (e.g., chemical vapor deposition), many of which also require corrosive gases. Typical temperatures for chemical vapor deposition (CVD) processes can reach about 300° C. or higher. At these temperatures a substrate is at risk of experiencing non-uniform processing which can degrade display quality. Specifically, in order to process uniformly across its entire surface, a substrate must be flat during processing. Thus, non-uniform processing may occur when the platform that supports the substrate deforms, causing the substrate to deform therewith. Platforms that support substrates during processing are conventionally known as susceptors, and are conventionally made of aluminum because of aluminum's excellent corrosion resistance when exposed to CVD processing chemicals. The strength of aluminum, however, begins to decline rapidly above 150° C. In fact, aluminum begins to soften at 250° C. and exhibits "liquid" type properties at about 660° C. Thus, when exposed to typical CVD processing temperatures, aluminum susceptors may deflect (e.g., bend or droop at the edges when supported at the center as is conventional). Such deflection is further exacerbated by the current trend toward larger and larger display sizes. Current display sizes are about 550×650 mm, and are projected to reach well above a square meter in the near future. As display size increases, so does susceptor size and the deflection associated therewith.

Accordingly, a susceptor that resists deflection during high temperature processing is needed.

SUMMARY OF THE INVENTION

In accordance with a first aspect of the present invention, an inventive susceptor is provided that includes (1) a supporting surface adapted to support a substrate, the supporting surface comprising a first material; and (2) a support frame encased within the first material, the support frame comprising a second material that has a lower coefficient of thermal expansion than the first material. The support frame is offset from a center of the susceptor toward the supporting surface. In one aspect of the invention, the first material is aluminum and the second material is stainless steel, although other materials may be similarly employed as described below.

In accordance with a second aspect of the present invention, an inventive susceptor is provided that includes (1) a supporting surface adapted to support a substrate, the supporting surface comprising a first material; and (2) a support frame encased within the first material, the support frame comprising a second material that has a higher coefficient of thermal expansion than the first material. The support frame is offset from a center of the susceptor away from the supporting surface. In one aspect of the invention, the first material is graphite and the second material is nickel, although other materials may be similarly employed as described below.

Other features and aspects of the present invention will become more fully apparent from the following detailed description of the preferred embodiments, the appended claims and the accompanying drawings.

DETAILED DESCRIPTION OF THE PREFERRED EMBODIMENTS

Figure 1:
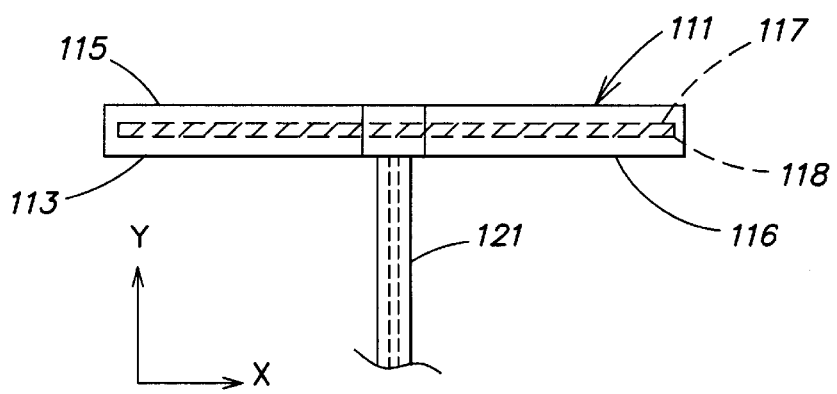
FIGS. 1–3 are side schematic views of an inventive susceptor, which show exemplary positions of a support frame encased therein.
Figure 2:
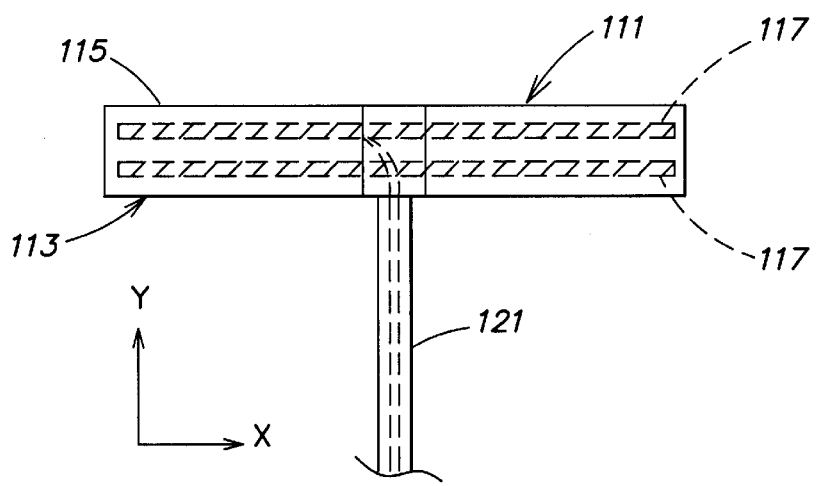
Figure 3:
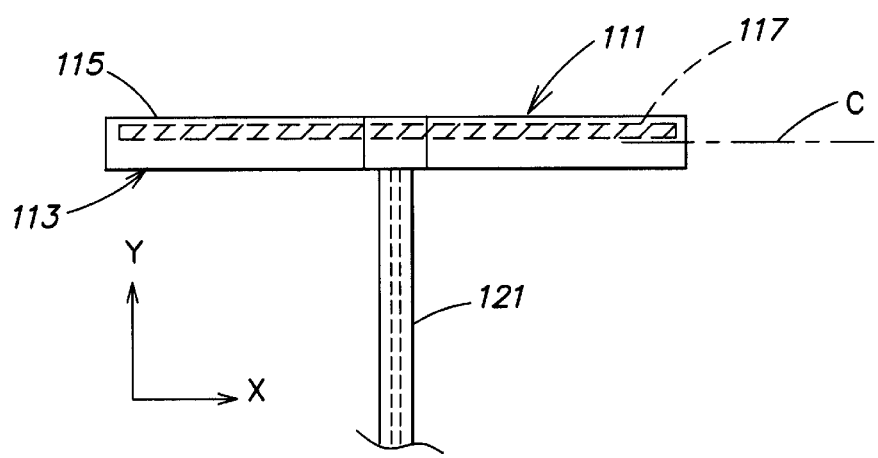
Figure 4:
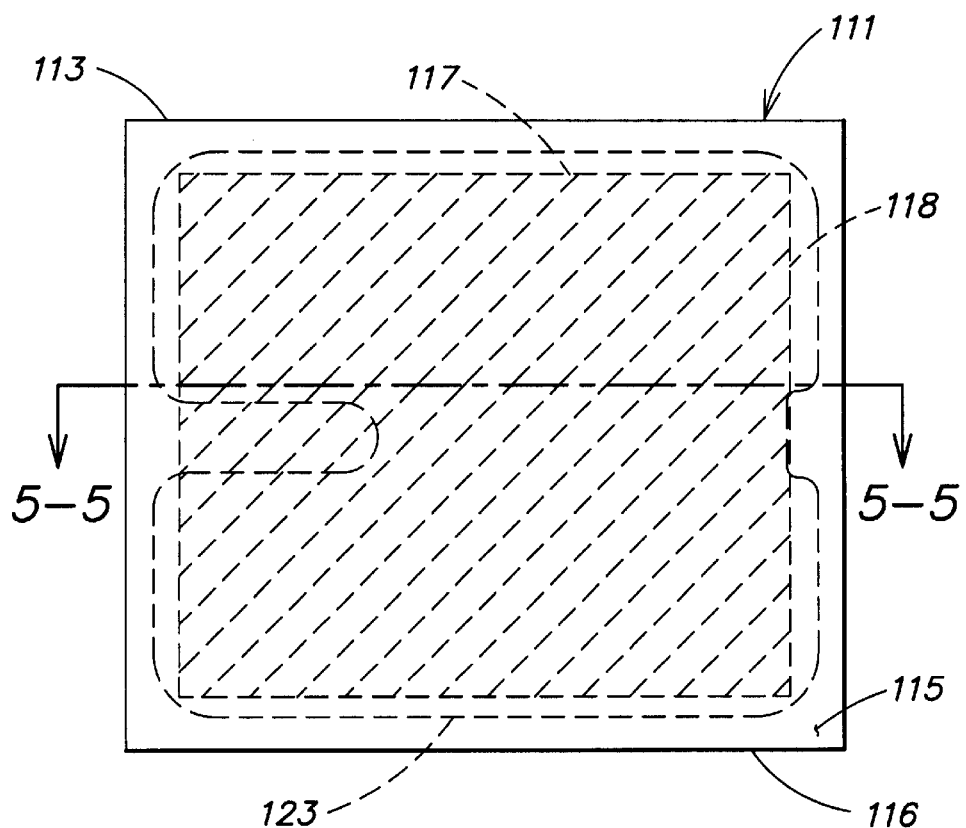
FIG. 4 is a top plan view of the inventive susceptor of FIGS. 1–3.

FIGS. 1–3 are side schematic views of an inventive susceptor 111, which show exemplary positions of a support frame encased within the inventive susceptor 111; and FIG. 4 is a top plan view of the inventive susceptor 111 of FIGS. 13.

With reference to FIGS. 1–4, the inventive susceptor 111 comprises an exterior surface 113 adapted to support a substrate via a substrate supporting surface 115. The exterior surface 113 comprises a first, "exterior" material 116, and the first, exterior material 116 encases a support frame 117. The support frame 117 comprises a second material 118 which in at least one embodiment has a higher mechanical strength at a processing temperature (e.g., 300° C. or higher) than the first, exterior material 116. Accordingly the support frame 117 may provide the susceptor 111 with mechanical strength at temperatures that approach or exceed the processing temperature.

The first, exterior material 116 may be vacuum compatible and may resist corrosion when exposed to chemicals employed during semiconductor processing (e.g., halogens (F, Cl, Br, I, etc.), halogen compounds, atomic form halogens such as fluorine atoms/ions, etc.). The first, exterior material 116 may comprise aluminum, for example, and the second material 118 of the support frame 117 may comprise stainless steel. Other materials may be employed for the first, exterior material 116 such as anodized stainless steel and/or for the second material 118 of the support frame 117 such as steel, titanium, nickel, ceramic or other high strength materials and/or compounds (e.g., metal matrix composites, mixtures of aluminum and ceramic, etc.). The support frame 117 may be a solid material, or may take any other form (e.g., an "open" structure such as a honeycomb pattern, a wave pattern or some other similar open pattern).

The support frame 117 may be cast within the first, exterior material 116 as is known in the art. In general, however, to make the inventive susceptor 111 via casting, the support frame 117 may be placed within a mold that provides the desired shape of the exterior surface 113. Molten exterior material (e.g., aluminum) then may be poured into the mold so as to encase the frame therewithin.

In one embodiment of the invention, the susceptor 111 has a width of about 620 mm, a length of about 750 mm and a thickness of about 2 inches. The first, exterior material 116 comprises aluminum and the second material 118 of the support frame 117 comprises solid stainless steel having a width of about 610 mm, a length of about 740 mm and a thickness of about 3 mm. In this embodiment, the width and length of the support frame 117 are selected (and the support frame 117 is positioned) so as to allow about 5 mm of exterior material 116 to surround the outer edges of the support frame 117. It will be understood that the susceptor 111 may assume any dimension, and that the appropriate dimensions of the support frame 117 will depend on numerous factors (e.g., the size of the susceptor 111, the type of material used for the exterior material 116, the type of material 118 used for the support frame 117, the structure/shape of the support frame 117, the position of the support frame 117 within the susceptor 111, etc.).

In general, the support frame 117 may be positioned within the inventive susceptor 111 so as to extend along a plane parallel to the substrate supporting surface 115. As shown in FIGS. 1–3, a pedestal 121 may be coupled to the inventive susceptor 111 or integrally formed therewith. The inventive susceptor 111 may optionally include a heating element 123 (FIG. 4), and the pedestal 121 (FIGS. 1–3) may provide a conduit through which the heating element 123 (FIG. 4) may extend in order to couple to a remote power source (e.g., which may be located outside a chamber in which the inventive susceptor 111 may be contained).

In at least one embodiment of the invention, the second material 118 of the support frame 117 is selected to have a coefficient of thermal expansion (CFE) that is less than the CFE of the first, exterior material 116 that surrounds the support frame 117. For example, if the first, exterior material 116 is aluminum (having a CFE of $23 \times 10^{-6}$), a suitable second material 118 for the support frame 117 is stainless steel (having a CFE of $16.7 \times 10^{-6}$). Other materials may be similarly employed. When heated, the first, exterior material 116 will expand approximately 1.4 times more than the second material 118 of the support frame 117. Depending on the position of the support frame 117 within the susceptor 111, the differing CFEs of the first and second materials 116, 118 may produce a "bi-metal" effect useful in compensating for gravity induced deflections of the inventive susceptor 111 (as described below).

Figure 5:
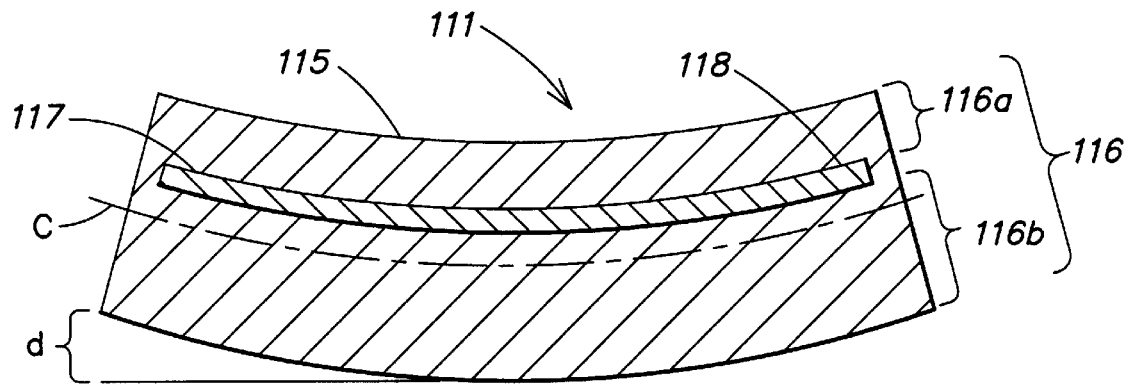
FIG. 5 is a cross sectional view of the inventive susceptor, taken along line 5—5 in FIG. 4, when the inventive susceptor is first exposed to a processing temperature.

FIG. 5 is a cross sectional view of the inventive susceptor 111, taken along line 5—5 in FIG. 4, when the inventive susceptor 111 is first exposed to a processing temperature (e.g., a temperature of 300° C. or higher). With reference to FIG. 5, when the supporting frame 117 is offset from a center line C of the susceptor 111 toward the substrate supporting surface 115, the first, exterior material 116 is divided into a first volume of material 116a (located between the supporting frame 117 and the substrate supporting surface 115) and a second volume of material 116b (located between the supporting frame 117 and a bottom surface of the susceptor 111). As shown in FIG. 5, the first volume of material 116a is less than the second volume of material 116b. Accordingly, when the susceptor 111 of FIG. 5 is heated to a processing temperature (e.g., a temperature of 300° C. or higher):

1. the first, exterior material 116 expands more than the support frame 117 (e.g., because the second material 118 of the support frame 117 has a smaller CFE than the CFE of the first, exterior material 116);
2. the second volume of material 116b expands farther than the first volume of material 116a (e.g., because there is more material in the second volume of material 116b);
3. the support frame 117 is "stretched" more by the expansion of the second volume of material 116b than by the expansion of the first volume of material 116a; and
4. the support frame 117 (and the susceptor 111) deflects (e.g., by an amount "d" as shown in FIG. 5) under the influence of the unequal forces created by the unequal expansion of the volumes of material 116a, 116b.

This "bi-metal" effect is a result/function of the offset of the support frame 117 from the center line C of the susceptor 111 toward the substrate supporting surface 115 of the susceptor 111 (as described further below).

Figure 6A:
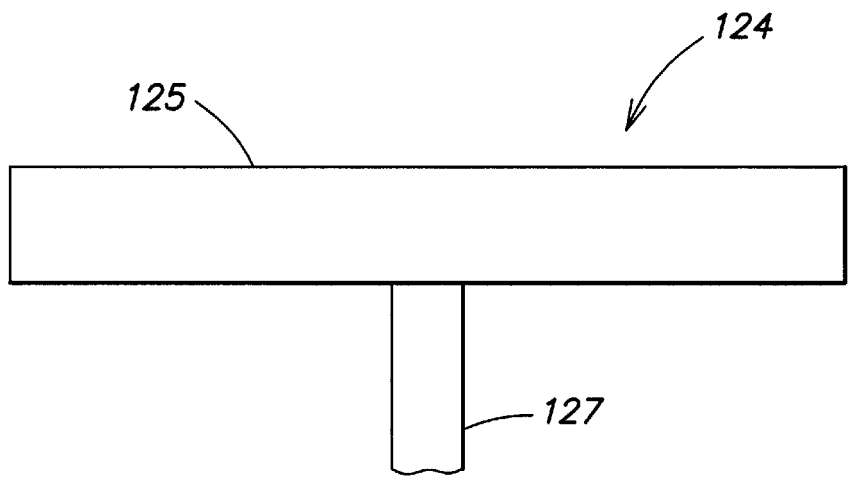
FIG. 6A is a side view of a conventional aluminum susceptor when the susceptor is first raised to a processing temperature.

As stated above, the "bi-metal", effect may be employed to compensate for gravity induced deflections of the inventive susceptor 111. For example, FIG. 6A is a side view of (new) conventional aluminum susceptor 124 when the susceptor 124 is first raised to a processing temperature. Susceptors are conventionally made of aluminum because of aluminum's excellent corrosion resistance when exposed to CVD processing chemicals, and because aluminum has a high thermal conductivity (e.g., which enables better thermal uniformity). The strength of aluminum, however, begins to decline rapidly above 150° C. In fact, aluminum begins to soften at 250° C. and exhibits "liquid" type properties at about 660° C.

Figure 6B:
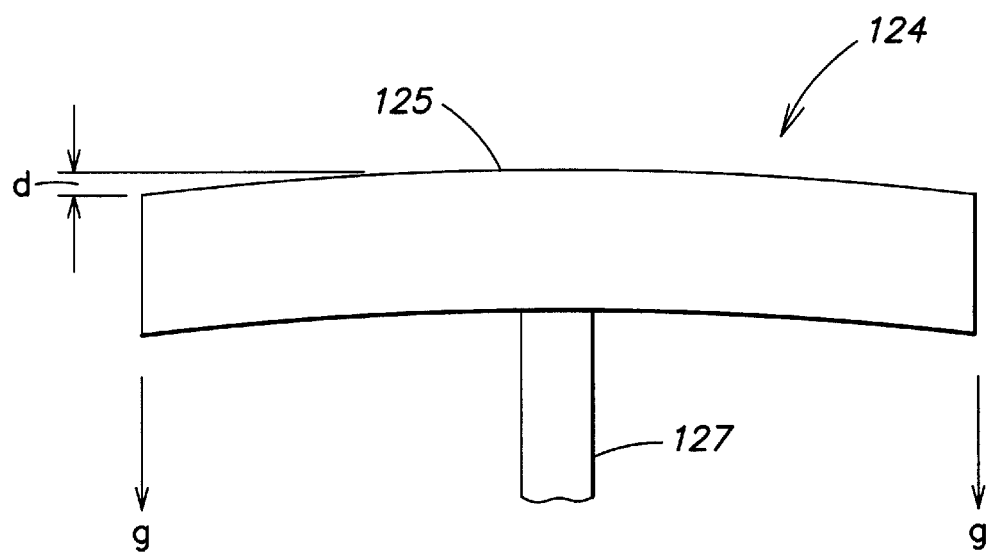
FIG. 6B is a side view of the conventional susceptor of FIG. 6A after the susceptor has been aged.

As shown in FIG. 6A, initially the conventional susceptor 124 has a substrate supporting surface 125 that is flat. However, because aluminum has low mechanical strength when heated, over time (e.g., typically within the time period required to test or "qualify" a new processing chamber) the susceptor 124 and the substrate supporting surface 125 will deflect downward under the influence of gravity "g" (e.g., as shown in FIG. 6B). Specifically, because gravity-induced moments of inertia are largest at the edges of the susceptor 125 (relative to a support pedestal 127 of the susceptor 125), the edges of the susceptor 124 "droop" over time, and the substrate supporting surface 125 becomes rounded. Non-uniform processing may occur when a susceptor deflects, as a substrate will deflect with the susceptor. Such deflections are further exacerbated by the current trend toward larger and larger display sizes. Current display sizes are about 550×650 mm, and are projected to reach well above a square meter in the near future. As display size increases, so does susceptor size and the deflection associated therewith.

Figure 7A:
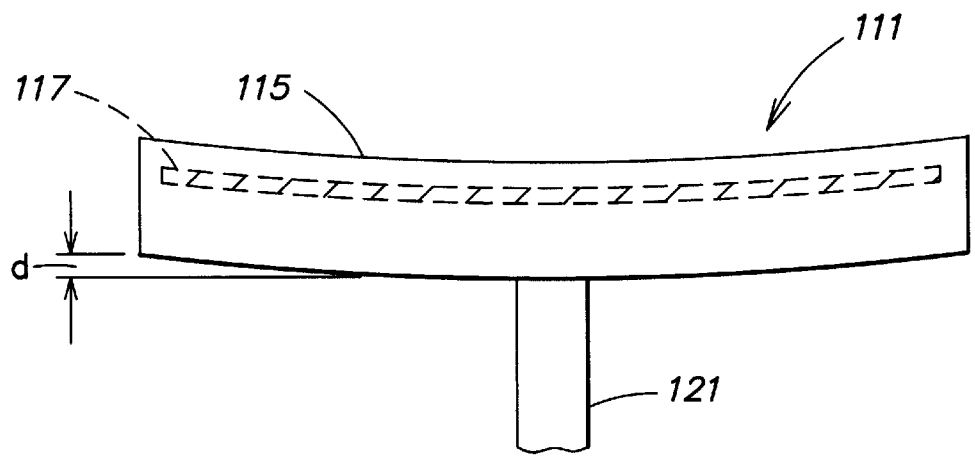
FIG. 7A is a side view of the inventive susceptor when the susceptor is first raised to a processing temperature.
Figure 7B:
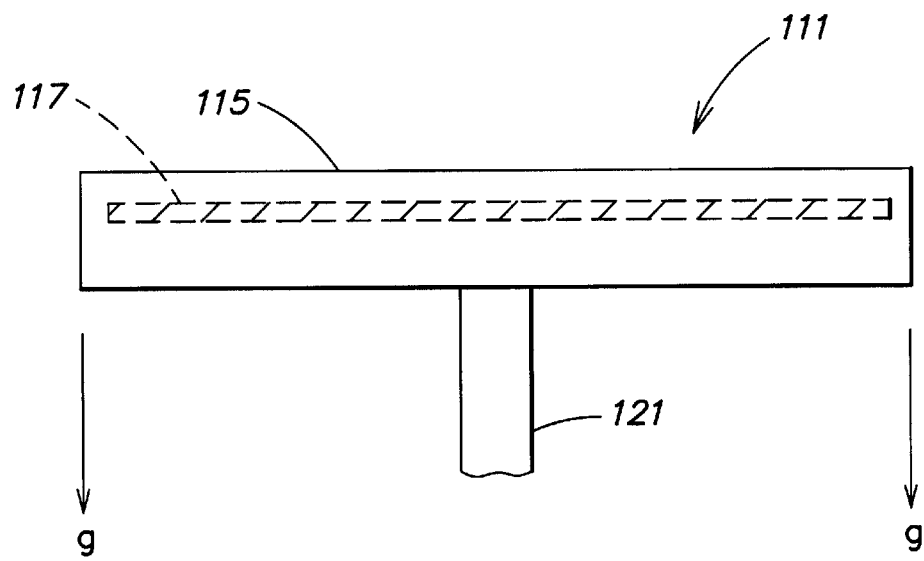
FIG. 7B is a side view of the inventive susceptor of FIG. 7A after the susceptor has been aged.

FIG. 7A is a side view of the inventive susceptor 111 when the susceptor 111 is first raised to a processing temperature (e.g., when the susceptor 111 is "new"). Assuming that the support frame 117 is offset toward the substrate supporting surface 115 (as shown), when the susceptor 111 is heated, the susceptor 111 will deflect upward (or in a direction opposite to the force of gravity) due to the bi-metal effect. Because aluminum has low mechanical strength when heated, over time (e.g., typically within the time period required to test or "qualify" a new processing chamber) the susceptor 111 and the substrate supporting surface 115 will deflect downward under the influence of gravity "g" (e.g., as shown in FIG. 7B). However, because (when heated) the susceptor 111 initially is deflected in a direction opposite to the force of gravity, the net result of gravity induced deflections in the susceptor 111 is to produce a flat substrate supporting surface 115 (FIG. 7B). Thereafter (e.g., after chamber qualification and during production processing), the substrate supporting surface 115 remains flat (e.g., allowing for highly uniform processing).

As will be understood to one of ordinary skill in the art, the amount of "upward" deflection required to compensate for gravity effects depends on a number of factors (e.g., characteristics of the first, exterior material 116, characteristics of the second material 118 of the support frame 117, the size of the susceptor 111, the size of the support frame 117, the structure of the support frame 117, the processing temperature employed, the processing time employed, etc.).

Various exemplary positions which the support frame 117 may assume within the susceptor 111 are shown in FIGS. 1–3. FIG. 1 shows the support frame 117 positioned in the center of the susceptor 111. FIG. 2 shows two support frames 117 embedded within the susceptor 111 in a spaced relationship (although any number may be employed). FIG. 3 shows the support frame 117 offset from a horizontal center line C of the susceptor 111 toward the substrate supporting surface 115.

Figure 8:
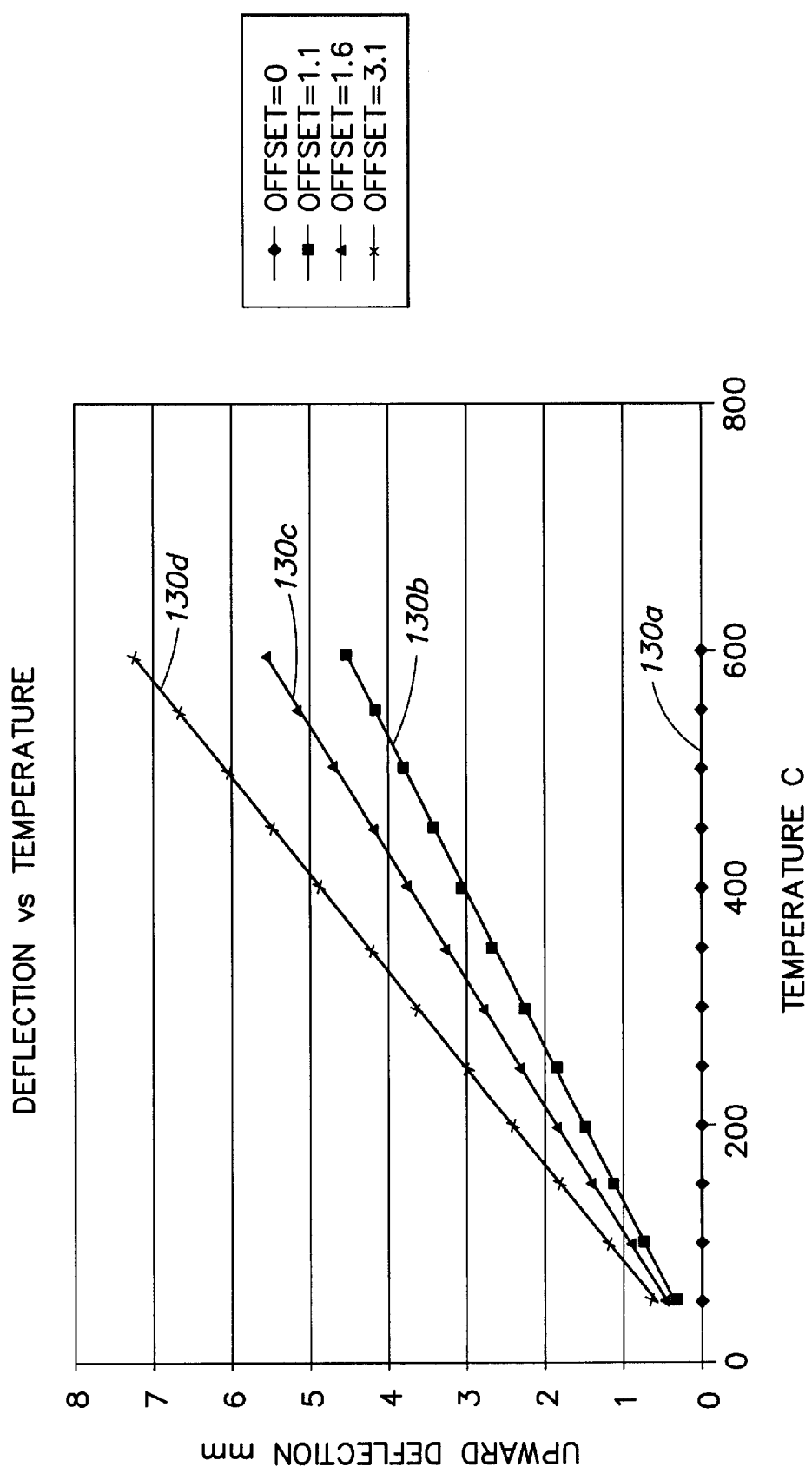
FIG. 8 is a graph of simulated upward edge deflection (e.g., in a direction opposite to gravity) versus temperature for four different inventive susceptors.

FIG. 8 is a graph of simulated upward edge deflection (e.g., in a direction opposite to the force of gravity) versus temperature for four different inventive susceptors 111. The simulation assumed that each susceptor 111 has a width of about 620 mm, a length of about 750 mm and a thickness of about 2 inches. The first, exterior material 116 comprises aluminum and the second material 118 of the support frame 117 comprises solid stainless steel having a width of about 610 mm, a length of about 740 mm and a thickness of about 3 mm. The simulation data was calculated for susceptors having a support frame 117 offset from a center line C (FIG. 3 or FIG. 5) toward the substrate support surface 115. The simulated offsets were zero (i.e., the support frame 117 was positioned at the center line C of the susceptor 111) as shown by curve 130a, 1.1 mm (curve 130b), 1.6 mm (curve 130c) and 3.1 mm (curve 130d).

As the graph of FIG. 8 shows, the inventive susceptor 111 experienced the most deflection (over 7 mm at 600° C.) when the support frame 17 was offset the most (e.g., 3.1 mm offset) from the center line C toward the substrate supporting surface 115, and experienced no deflection when the support frame 17 was located at the center line C (e.g., 0 mm offset). Offsets of 1.1 mm and 1.6 mm produced deflections intermediate to the deflections of the 0 mm and 3.1 mm offsets (as shown). Note that at a processing temperature of about 550° C., a 620 mm×720 mm×2 inch aluminum susceptor typically experiences about a 5 mm gravity-induced edge deflection over time. Accordingly, about a 1.6 mm support frame 117 offset should compensate for such a deflection (as shown in FIG. 8).

Inventive susceptors such as those described above can be employed within any high-temperature processing chamber, and are particularly well suited for use in high temperature processes such as the chemical vapor deposition (CVD) of polysilicon. An exemplary CVD chamber that may be employed to deposit polysilicon is shown and described with reference to FIG. 9.

Figure 9:
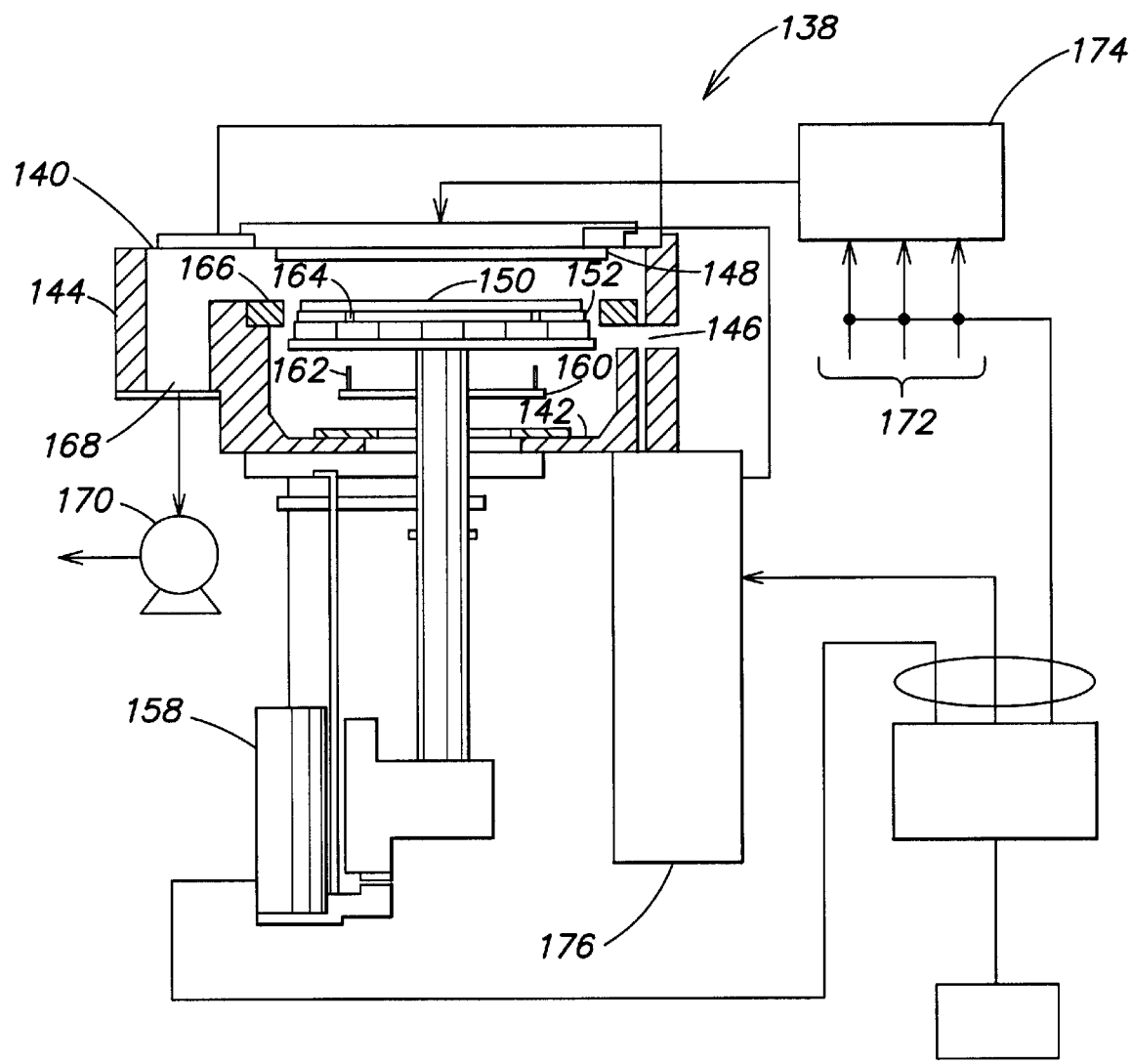
FIG. 9 is a schematic side view of a chemical vapor deposition chamber that may employ the inventive susceptor of FIGS. 1–4.

FIG. 9 is a schematic side view of a chemical vapor deposition (CVD) chamber 138, such as a CVD chamber available from AKT, Inc. having offices in Santa Clara, Calif. The chamber 138 is a parallel plate CVD chamber having a top 140, a bottom 142, sidewalls 144 and an opening 146 disposed in the sidewall through which substrates are delivered and retrieved from the chamber. Chamber 138 contains a gas distribution manifold 148, known as a diffuser, for dispersing process gases through perforated holes in the manifold to a substrate 150 that rests on a susceptor 152, which may be configured in accordance with the invention.

By configuring the susceptor 152 in accordance with the invention, it may be possible to achieve more rapid and uniform substrate heating. The susceptor 152 and the substrate 150 supported on the susceptor 152 can be controllably moved by a lift motor 158, known as a Z-drive, to adjust the spacing between the manifold 148 and the substrate 150. The spacing between the manifold 148 and the substrate 150 typically ranges between about 200 mils to about 1000 mils. The susceptor 152 is movable between a lower loading/offloading position and an upper processing position that is closely adjacent to the manifold 148. A lift plate 160 having lift pins 162 is disposed below the susceptor 152. When the susceptor 152 is lowered, the lift pins 162 protrude through holes 164 in the susceptor 152 to lift the substrate 150 from the susceptor and facilitate delivery and retrieval of the substrate 50 to and from the chamber 138. An insulator 166 may surround the susceptor 152 and the substrate 150.

Deposition and carrier gases are input through gas supply lines 172 into a mixing system 174 where they are combined and then sent to manifold 148. Alternatively, the mixing system 174 may be omitted and the gases flown to the manifold 148 directly. During processing, gases flown to manifold 148 are uniformly distributed across the surface of the substrate. The gases exhaust through a port 168 by a vacuum system 170 having a throttle valve (not shown) to control the pressure in the chamber 138 by controlling the exhaust rate of gas from the chamber 138.

The deposition process performed in chamber 138 can be any process, such as a thermal process or a plasma-enhanced process. In a plasma-enhanced process, a controlled plasma is formed adjacent to the substrate by RF energy applied from an RF power supply 176 to the gas distribution manifold 148, or to another plasma energizing device or structure. The susceptor 152 is grounded and the manifold 148 is electrically isolated from the chamber surfaces. The plasma creates a reaction zone between the gas distributor manifold 148 and the substrate 150 that enhances the reaction between the process gases.

A susceptor configured in accordance with the present invention may contribute significantly to the value of the processing chamber 138 by enabling substrates to receive more uniform processing. While the above system is exemplary, the invention has application in any arrangement that supports a substrate, and, thus, it is understood that other applications of the invention are contemplated. While described as horizontally oriented, other susceptor orientations may be employed such as a tilted susceptor, a vertically oriented susceptor, etc.

The foregoing description discloses only the preferred embodiments of the invention, and modifications of the above disclosed apparatus and method which fall within the scope of the invention will be readily apparent to those of ordinary skill in the art. For instance, although the inventive susceptor has been described with reference to the processing of flat panel displays, it will be understood that the inventive susceptor may be advantageously employed within any high temperature process (i.e., 300° C. and higher) that requires the support of large (i.e., greater than 300 mm in one direction) substrates. Accordingly, the term "substrate" refers to any large thin object including flat panel displays, semiconductor substrates, etc. Other exemplary high temperature processes which may benefit from use of the inventive susceptor include physical vapor deposition, etc.

While the inventive susceptor of FIGS. 1–5 has been described with reference to a first, exterior material 116 that encases a support frame 117 that is offset toward a substrate supporting surface 115 of the susceptor 111 and that has a lower coefficient of thermal expansion than the first, exterior material 116, it will be understood that other configurations and materials may be similarly employed. For example, the support frame 117 may have a higher coefficient of thermal expansion than the first, exterior material 116 and may be offset from a center of the susceptor away from the substrate supporting surface 115 as described below with reference to FIGS. 10A and 10B. In such an alternative embodiment, the first, exterior material 116 may comprise graphite, for example, and the second material 118 of the support frame 117 may comprise nickel. Other materials may be employed for the first, exterior material 116 such as glass and/or for the second material 118 of the support frame 117 such as stainless steel, ceramic, titanium, etc. Note that when the second material 118 has a higher coefficient of thermal expansion than the first, exterior material 116 and when the support frame 117 is offset from a center of the susceptor 111 away from the substrate supporting surface 115, the larger volume of the first, exterior material 116 located between the support frame 117 and the substrate supporting surface 115 will resist expansion of the support frame 117 (when the susceptor 111 is heated) more than the smaller volume of the first, exterior material 116 located between the support frame 117 and the bottom the of susceptor 111. Accordingly, the susceptor 111 will exhibit a bi-metal effect and will tend to deflect upward.

Figure 10A:
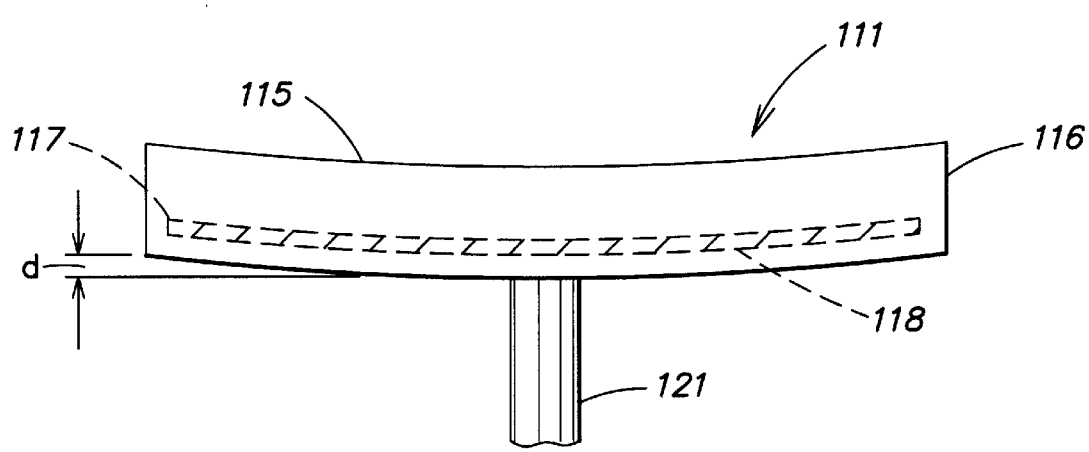
FIG. 10A is a side view of an alternative embodiment for the inventive susceptor when the susceptor is first raised to a processing temperature.
Figure 10B:
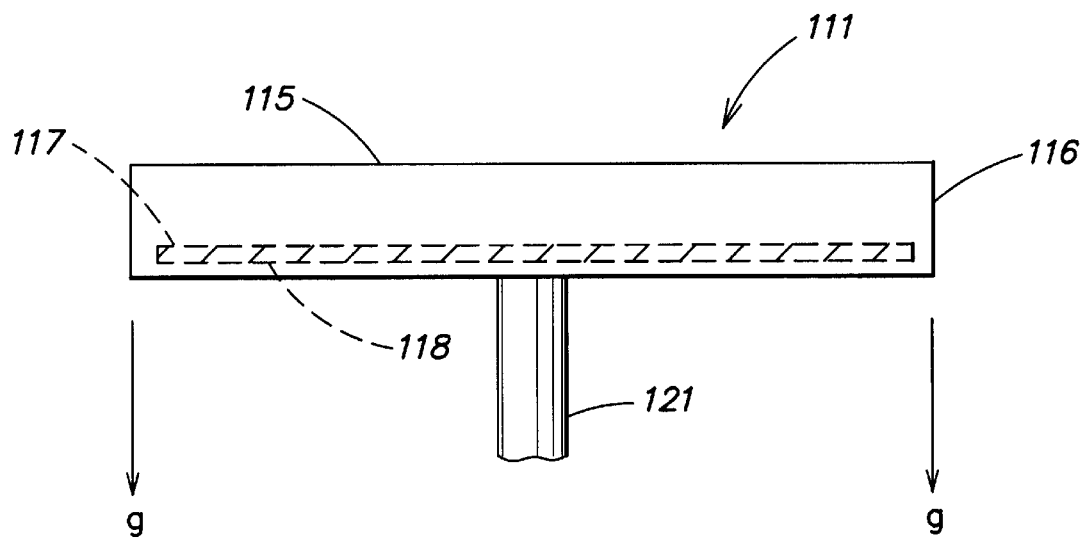
FIG. 10B is a side view of the inventive susceptor of FIG. 10A after the susceptor has been aged.

FIG. 10A is a side view of an alternative embodiment of the inventive susceptor 111 when the susceptor 111 is first raised to a processing temperature (e.g., when the susceptor 111 is "new"). In the embodiment of FIG. 10A, the support frame 117 has a higher coefficient of thermal expansion than the first, exterior material 116 and is offset from a center of the susceptor 111 away from the substrate supporting surface 115 (as shown). When the susceptor 111 is heated, the susceptor 111 will deflect upward (or in a direction opposite to the force of gravity) due to the bimetal effect. Because the exterior material 116 (e.g., aluminum) typically has low mechanical strength when heated, over time (e.g., typically within the time period required to test or "qualify" a new processing chamber) the susceptor 111 and the substrate supporting surface 115 will deflect downward under the influence of gravity "g" (e.g., as shown in FIG. 10B). However, because (when heated) the susceptor 111 initially is deflected in a direction opposite to the force of gravity, the net result of gravity induced deflections in the susceptor 111 is to produce a flat substrate supporting surface 115 (FIG. 10B). Thereafter (e.g., after chamber qualification and during production processing), the substrate supporting surface 115 remains flat (e.g., allowing for highly uniform processing).

Accordingly, while the present invention has been disclosed in connection with the preferred embodiments thereof, it should be understood that other embodiments may fall within the spirit and scope of the invention, as defined by the following claims.

The invention claimed is:

1. A susceptor comprising:
a supporting surface adapted to support a substrate, the supporting surface comprising a first material; and
a support frame encased within the first material, the support frame comprising a second material that has a lower coefficient of thermal expansion than the first material;
wherein:
the support frame is offset from a center of the susceptor toward the supporting surface; and
an edge of the supporting surface deflects upwardly during a first heating of the susceptor, and the supporting surface is substantially flat during a second heating of the susceptor that is subsequent to the first heating.

2. The susceptor of claim 1 further comprising a heating element encased within the first material.

3. The susceptor of claim 1 wherein the second material has a higher mechanical strength at a processing temperature than the first material.

4. The susceptor of claim 3 wherein the processing temperature is at least 300° C.

5. The susceptor of claim 1 wherein the first material is aluminum and wherein the second material is stainless steel.

6. The susceptor of claim 5 further comprising a heater enclosed within the first material.

7. The susceptor of claim 1 wherein the supporting surface is a horizontal surface.

8. The susceptor of claim 7 wherein the supporting surface is an upper surface of the susceptor.

9. The susceptor of claim 1 wherein the supporting surface of the susceptor is sized so as to support a substrate having a size of at least 550 mm×650 mm.

10. The susceptor of claim 1 wherein the first material is vacuum compatible and resists corrosion when exposed to an environment containing at least one of a halogen, a halogen compound and an atomic form halogen.

11. A chamber comprising:
a chamber wall that encloses a processing region; and
a susceptor contained within the processing region, the susceptor having:
a supporting surface adapted to support a substrate, the supporting surface comprising a first material; and
a support frame encased within the first material, the support frame comprising a second material that has a lower coefficient of thermal expansion than the first material;
wherein:
the support frame is offset from a center of the susceptor toward the supporting surface; and
an edge of the supporting surface deflects upwardly during a first heating of the susceptor, and the supporting surface is substantially flat during a second heating of the susceptor that is subsequent to the first heating.

12. The chamber of claim 11 wherein the susceptor further comprises a heater encased within the first material, wherein the heater is adapted to heat the susceptor to temperatures of 300° C. or more.

13. A process for making a susceptor adapted to support a substrate, comprising:
providing a support frame; and
encasing the support frame in an exterior material such that the exterior material forms a supporting surface adapted to support a substrate and such that the support frame is offset from a center of the susceptor toward the supporting surface, wherein the support frame comprises a material that has a lower coefficient of thermal expansion than does the exterior material; and
an edge of the supporting surface deflects upwardly during a first heating of the susceptor, and the supporting surface is substantially flat during a second heating of the susceptor that is subsequent to the first heating.

14. The process of claim 13 wherein the exterior material comprises aluminum and wherein the support frame comprises stainless steel.

15. The process of claim 13 further comprising:

providing a heating element; and encasing the heating element within the exterior material.

16. The process of claim 15 wherein the exterior material comprises aluminum and wherein the support frame comprises stainless steel.

17. The process of claim 13 wherein the support frame has a higher mechanical strength at a processing temperature than the exterior material.

18. The process of claim 17 wherein the processing temperature is at least 300° C.

19. A susceptor comprising:

a supporting surface adapted to support a substrate, the supporting surface comprising a first material; and a support frame encased within the first material, the support frame comprising a second material that has a higher coefficient of thermal expansion than the first material;

wherein:

the support frame is offset from a center of the susceptor away from the supporting surface; and an edge of the supporting surface deflects upwardly during a first heating of the susceptor, and the supporting surface is substantially flat during a second heating of the susceptor that is subsequent to the first heating.

20. The susceptor of claim 19 wherein the second material has a higher mechanical strength at a processing temperature than the first material.

21. The susceptor of claim 20 wherein the processing temperature is at least 300° C.

22. The susceptor of claim 19 wherein the first material is graphite and wherein the second material is nickel.

23. The susceptor of claim 22 further comprising a heater enclosed within the first material.

24. A chamber comprising:

a chamber wall that encloses a processing region; and a susceptor contained within the processing region, the susceptor having:

a supporting surface adapted to support a substrate, the supporting surface comprising a first material; and a support frame encased within the first material, the support frame comprising a second material that has a higher coefficient of thermal expansion than the first material;

wherein:

the support frame is offset from a center of the susceptor away from the supporting surface; and an edge of the supporting surface deflects upwardly during a first heating of the susceptor, and the supporting surface is substantially flat during a second heating of the susceptor that is subsequent to the first heating.

25. The chamber of claim 24 wherein the susceptor further comprises a heater encased within the first material, wherein the heater is adapted to heat the susceptor to temperatures of 300° C. or more.

26. A process for making a susceptor adapted to support a substrate, comprising:

providing a support frame; and encasing the support frame in an exterior material such that the exterior material forms a supporting surface adapted to support a substrate and such that the support frame is offset from a center of the susceptor away from the supporting surface, wherein the support frame comprises a material that has a higher coefficient of thermal expansion than does the exterior material; and an edge of the supporting surface deflects upwardly during a first heating of the susceptor, and the supporting surface is substantially flat during a second heating of the susceptor that is subsequent to the first heating.

* * * * *